United States Patent
Yen-Huei

(10) Patent No.: US 8,437,204 B2
(45) Date of Patent: May 7, 2013

(54) MEMORY ARRAY WITH CORRESPONDING ROW AND COLUMN CONTROL SIGNALS

(75) Inventor: Chen Yen-Huei, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 285 days.

(21) Appl. No.: 12/792,944

(22) Filed: Jun. 3, 2010

(65) Prior Publication Data

US 2010/0315890 A1 Dec. 16, 2010

Related U.S. Application Data

(60) Provisional application No. 61/186,590, filed on Jun. 12, 2009.

(51) Int. Cl.
*G11C 7/00* (2006.01)

(52) U.S. Cl.
USPC .. 365/191; 365/154; 365/189.08; 365/189.17

(58) Field of Classification Search .............. 365/189.17
See application file for complete search history.

(56) References Cited

U.S. PATENT DOCUMENTS

| | | | | |
|---|---|---|---|---|
| 4,467,456 A | * | 8/1984 | Oritani | 365/190 |
| 4,665,507 A | * | 5/1987 | Gondou et al. | 365/190 |
| 4,712,194 A | * | 12/1987 | Yamaguchi et al. | 365/203 |
| 5,047,979 A | * | 9/1991 | Leung | 365/154 |
| 5,051,955 A | * | 9/1991 | Kobayashi | 365/189.02 |
| 5,243,574 A | * | 9/1993 | Ikeda | 365/207 |
| 5,539,691 A | * | 7/1996 | Kozaru et al. | 365/189.05 |
| 6,137,715 A | * | 10/2000 | Cho | 365/156 |
| 6,522,565 B2 | * | 2/2003 | Shimazaki et al. | 365/63 |
| 6,760,269 B2 | * | 7/2004 | Nakase et al. | 365/210.13 |
| 7,800,959 B2 | * | 9/2010 | Childs et al. | 365/189.08 |
| 8,009,489 B2 | * | 8/2011 | Zhang et al. | 365/189.16 |

OTHER PUBLICATIONS

Morita, Yasuhiro, et al., "An Area-Conscious Low-Voltage-Oriented 8T-SRAM Design Under DVS Environment", 2007 Symposium on VLSI Circuits Digest of Technical Papers, pp. 256-257.

* cited by examiner

*Primary Examiner* — Tan T. Nguyen

(74) *Attorney, Agent, or Firm* — Lowe Hauptman Ham & Berner, LLP

(57) ABSTRACT

Some embodiments regard a method comprising: controlling a row of cells of a memory array with a first signal; controlling a column of cells of the memory array with a second signal; transferring data from a cell activated by both the first signal and the second signal to a pair of bit lines associated with the cell; and using the data from the pair of bit lines as read data and as data written back to the cell to ensure the cell stores valid data.

20 Claims, 2 Drawing Sheets

MEMORY ARRAY WITH CORRESPONDING ROW AND COLUMN CONTROL SIGNALS

CROSS-REFERENCE TO RELATED APPLICATIONS

The present application claims priority of U.S. Provisional Patent Application Ser. No. 61/186,590, filed on Jun. 12, 2009, which is incorporated herein by reference in its entirety.

TECHNICAL FIELD

The present disclosure is generally related to a memory array. In particular, a memory cell of the array includes corresponding row and column control signals, and a write-back feature after reading.

BACKGROUND

Conventional 6T-2port (6 transistors-2-port) SRAM cells generally suffer from dummy read disturb in write operation. For example, a signal (e.g., signal RWWL) is used for both reading and writing, and this signal RWWL controls all memory cells in the same row. As a result, when signal RWWL is activated to write to a cell (e.g., cell W), for example, this signal RWWL not only activates the cell to be written W but also affects other cells in the same row (e.g., cells R). In effect, a "dummy" read operation is performed on these cells R, which can disturb the write operation, including, for example, reducing the noise margin of the cross latch storing data for the memory.

8T-2 port SRAMs in which a read operation is performed before writing may be used to avoid the above deficiencies. As a result, in a write cycle, there are two operations including first reading the data then latching the data to be written into the cell. To achieve this read-first then write operation, the approach uses column-based sense amplifiers in which each column includes an inverter sense amplifier being coupled to all cells in that column. Because the inverter sense amplifier is coupled to all cells in a column, if one cell is activated, other un-activated (e.g., unselected) cells can be affected. Further, because the approach requires a read operation before writing, the write operation timing is degraded (e.g., long) as additional time in the same cycle is needed for reading. The approach also requires a D-latch to latch the written data, which adds complexity (e.g., control signal for the latch, etc.) and additional layout areas to the circuitry.

BRIEF DESCRIPTION OF THE DRAWINGS

The details of one or more embodiments are set forth in the accompanying drawings and the description below. Other features and advantages of the invention will be apparent from the description, drawings, and claims.

Like reference symbols in the various drawings indicate like elements.

DETAILED DESCRIPTION

Figure 1:
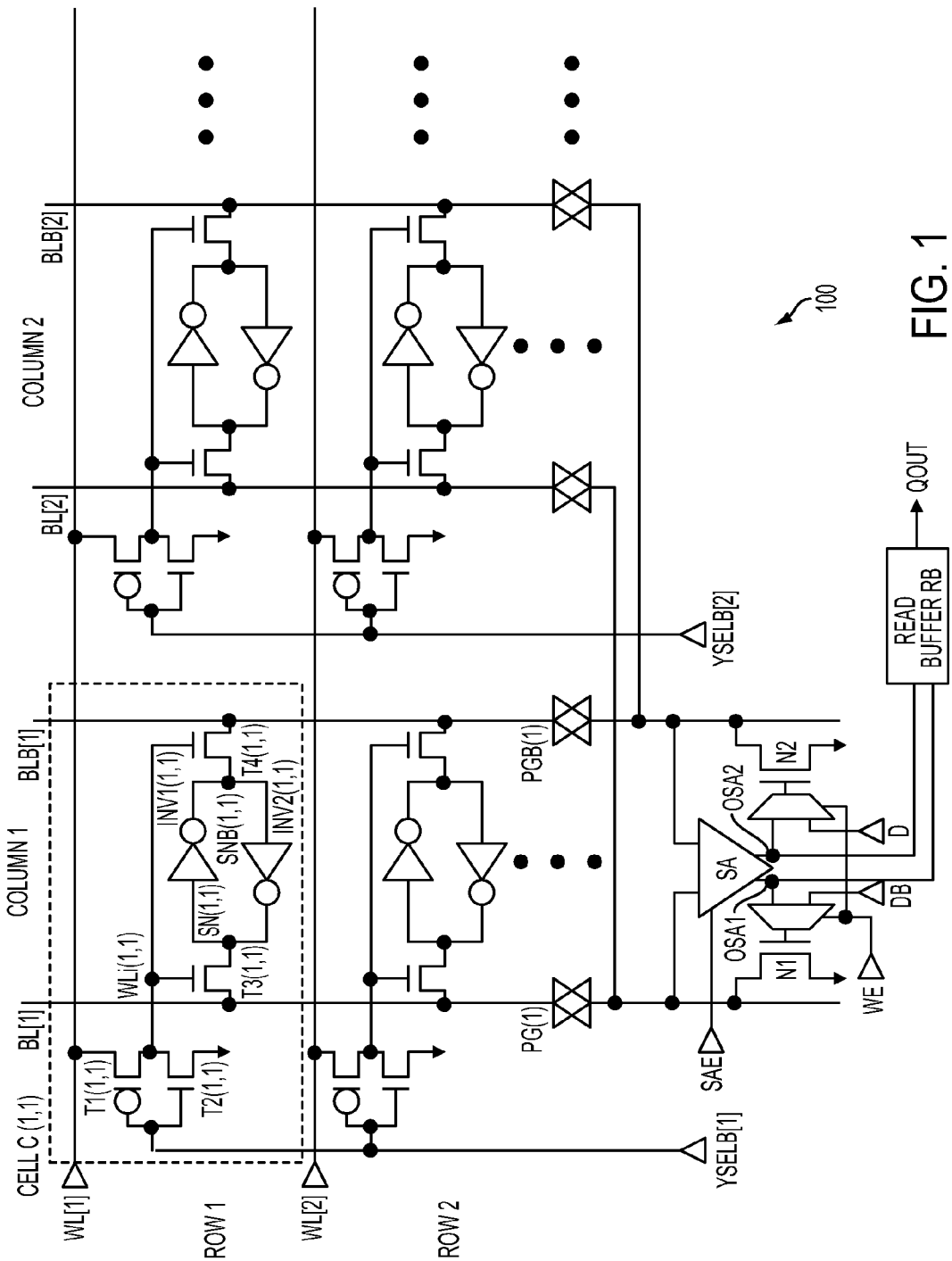
FIG. 1 shows an array of SRAM according to an embodiment.

Embodiments or examples illustrated in the drawings are now described using specific languages. It will nevertheless be understood that no limitation of the scope of the invention is thereby intended. Any alterations and modifications in the described embodiments, and any further applications of principles of the invention described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

The SRAM Array and Read Operation

FIG. 1 shows an array of SRAM 100 upon which embodiments of the invention may be implemented. For illustration purposes, array 100 includes i number of columns and j number of rows, and thus i×j number of cells C. For simplicity FIG. 1 shows only two rows and two columns 1 and 2 including cells C(1,1), C(1,2), C(2,1), and C(2,2) (not all depicted cells are labeled). Further, only elements of cell C(1,1) are labeled and the below explanation is based on this cell C(1,1), but elements of other cells C are compatible and operate in the same way as cell C(1,1) does when receiving appropriate corresponding inputs.

Each cell of cells C includes a pair of transistors T1 and T2 acting as an inverter and coupled to a 6-transistor cell, which in turn includes transistors T3 and T4 and two transistors (not shown) in each inverters INV1 and INV2, respectively.

A pair of nodes SN and SNB stores data for the corresponding cell of cells C in array 100. Generally, data in nodes SN are complement to that of in nodes SNB. For example, if a node SN (e.g., node SN(1,1)) stores a logic low, then the corresponding node SNB(1,1) stores a logic high; and if node SN(1,1) stores a logic high, then node SNB(1,1) stores a logic low, etc. A pair of signals BL and BLB corresponding to a column of array 100 is also complement of one another. Signals BL and BLB via corresponding pass gates PG are coupled to the inputs of sense amplifier SA, and are used for reading data from and writing data to nodes SN and SNB.

A signal WL (e.g., WL(1) ... WL(i)) coupled to the source of transistors T1 controls cells C in a row while a signal YSELB (e.g., YSELB(1)...YSELB(j)) coupled to the gate of transistors T1 and T2 controls cells C in a column. PMOS transistors T1 and NMOS transistors T2 together act as an inverter that based on the data (e.g., the logic state, the voltage level, etc.) from signal YSELB, provide the inverse data to nodes WLi. When signals YSELB are activated (e.g., low), they turn on transistors T1 and turn off transistors T2. When transistors T1 are on, signals WL are passed through transistors T1 to nodes WLi. Once passed to nodes WLi, if signals WL are activated (e.g. high), they turn on transistors T3 and T4.

In various embodiments, to activate one of the cells C for reading or writing, a pair of corresponding signal WL and signal YSELB is activated. In the embodiment of FIG. 1, signals WL are high activated while signals YSELB are low activated. For example, to activate a cell C(1,1), signal WL(1) is activated high and signal YSELB(1) is activated low while signals WL from row 2 to row j (e.g., signals WL(2) to W(j)) are deactivated (e.g., low) and signals YSELB from column 2 to column j are deactivated (e.g., high). Because signals WL from row 2 to row j are deactivated (e.g., low), even if they are passed to nodes WLi in row 2 to row j (e.g., nodes WLi(1,2) to WLi(1,j)), these nodes stay low and therefore turn off transistors T3 and T4 from row 2 to row j (e.g., transistors T3(1,2) and T4(1,2) to T3(1,j) and T4(1,j)).

Because signal YSELB(1) of column 1 is activated, it turns on transistor T1(1,1) and turns off transistor T2(1,1). Because signals YSELB of column 2 to column i (e.g., signals YSELB (2) to YSELB(i)) are deactivated (e.g., high), transistors T1 in columns 2 to columns i are off (e.g., transistors T1(2,1) to T1(i,1), T1(2,2) to T1(i,2), and T1(2,j) to T1(i,j)) are off), which prevents signals WL from row 1 to row j (e.g., signals WL(1) to WL(j)) from being passed to nodes WLi from column 2 to column i (e.g., nodes WLi(2,1) to WLi(i,1)). Alternatively expressed, nodes WLi from column 2 to column i are low (e.g., nodes WLi(2,1) to WLi(i,1), WLi(2,2) to WLi(i,2), and WLi(2,j) to WLi(i,j) are low). As a result, transistors T3 and T4 from columns 2 to column i are off (e.g., transistors T3(2,1) and T4(2,1) to T3(i,1) to T4(i,1), T3(2,2) and T4(2,2) to T3(i,2) and T4(i,2), and T3(2,j) and T4(2,j) to T3(i,j) and T4(i,j) are off).

In effect, only the selected cell, e.g., cell C(1,1) is turned on while unselected cells C including cells C in columns 2 to column i and cells C from row 2 to row j are off (e.g., cells C(2,1) to C(i,1) and cells C(1,2) to C(i,j)) are off). As a result, in various embodiments, there is no dummy read in unselected cells C, and the memory array according to one or more embodiments does not experience read disturbance experienced by other approaches due to those dummy read.

To read from a node SN, the corresponding pair of signals BL and BLB are pre-charged to a predetermined voltage level, such as a high voltage level (e.g., Vdd). Depending on the data stored in nodes SN and SNB, one of signals BL and BLB remains at the high level while the other signal discharges towards a low resulting in a voltage difference between the two signals BL and BLB. Sense amplifier SA detects and amplifies this voltage difference to provide the appropriate logic level (e.g., read data) of the read node to output Qout. For example, to read from node SN(1,1), the pair of signals BL(1) and BLB(1) is pre-charged to a high voltage level. The activated signal WL(1) is then passed from the drain of transistor T1(1,1) to its source or node WLi(1,1). In addition, because signal WL(1) is activated (e.g., high), node WLi(1,1) is high and as a result turns on transistors T3(1,1) and T4(1,1), which in turns transfers the data from nodes SN(1,1) and SNB(1,1) to lines BL(1) and BLB(1). If node SN(1,1) stores a low, then signal BL(1) starts to discharge towards ground. Alternatively expressed, the voltage level of signal BL(1) is lowered from Vdd to Vdd−Dv. Sense amplifier SA, through pass gates PG(1) and PGB(1), receiving signals BL(1) with Vdd−Dv and BLB(1) with Vdd, detects the voltage difference between signals BL(1) and BLB(1) and provides a low to output Qout. If node SNB(1,1) stores a low then signal BLB(1) starts to discharge towards ground or, alternatively expressed, the voltage level of signal BLB(1) is lowered from Vdd to Vdd−Dv. Sense amplifier SA, through pass gates PG(1) and PGB(1), receiving signals BL(1) with Vdd and BLB(1) with Vdd−Dv, detects the voltage difference and provides a high to Qout.

To write to nodes SN and SNB the corresponding word line signal WL is activated, data is placed at the corresponding signals BL and BLB and thus is written to nodes SN and SNB. For example, to write to cell C(1,1), signal WL(1) of row 1 is activated while signals WL in rows two to row j (e.g., signals WL(2) to WL(j)) are deactivated. Data is placed at line BL (e.g., low) and line BLB (e.g., high) and is thus written to nodes SN(1,1) and SNB(1,1). In the embodiment of FIG. 1, data to be written is placed at lines D and DB so that when signal WE is activated (e.g., high), this data is transferred through transistors N1 and N2 to signals BL and BLB. In the write-back operation after reading/sensing, signal WE is deactivated so that the data provided by sense amplifier SA is provided to signals BL and BLB.

Pass gates PG when appropriate are activated to transfer data on bit lines BL and BLB to the inputs of sense amplifier SA.

Write Back Operation

In various embodiments, both signals BL and BLB are pre-charged to a high (e.g., Vdd) before a read operation. Further, when nodes WLi are high they turn on transistors T3 and T4, which could disturb neighboring components such as signals BL and BLB, nodes SN and SNB, etc., and may be referred to as read disturb. For example, signals BL or signals BLB, depending on the data stored in nodes SN and SNB, start to discharge. If nodes SN store a low then signals BL start to discharge because current starts flowing from signals BL through transistor T3 to node SN. If nodes SNB store a low then signals BLB start to discharge because current starts flowing from signals BLB through transistors T4 to nodes SNB. If discharging continues without appropriate control, data in nodes SN and SNB may flip. In various embodiments, signals BL and BLB are passed to sense amplifiers SA so that the data can be written back to the storage nodes SN and SNB. In effect, the appropriate data in nodes SN and SNB are maintained, and embodiments therefore prevent the read disturb.

For illustration purposes, only cell C(1,1) is activated and node SN(1,1) stores a low. By operation of array 100 (and of cell C(1,1)), node SNB(1,1) stores a high, and signals BL(1) and BLB(1) are pre-charged before a read operation. Because cell C(1,1) is activated, node WLi(1,1) is high and thus turns on transistor T3(1,1), causing current to flow from signal BL(1) to node SN(1,1). As a result, signal BL(1) is discharging. Signal BLB(1), however, maintains at the high level (e.g., Vdd). As signal BL is discharged, its voltage level is lowered, e.g., from Vdd to Vdd−Dv. Sense amplifier SA recognizing the voltage difference between signals BL(1) and BLB(1) detects the logic states stored in nodes SN(1,1) and SNB(1,1).

In some embodiments, signals BL(1) and BLB(1) are passed through pass gates PG(1) and PGB(1) to sense amplifier SA to subsequently write back the data to nodes SN(1,1) and SNB(1,1). In effect, sense amplifier SA, based on the information received from signals BL(1) and BLB(1) provides a high (e.g., Vdd) to the gate of transistor N1 to turn it on so that it pulls signal BL(1) from its level of Vdd−Dv to ground. Sense amplifier SA also provides a low (e.g., ground) to the gate of transistor N2 to turn it off. Because transistor N2 is off, signal BLB(1) is not affected and remains at its high level of Vdd. The logic level low at signal BL(1) and high at signal BLB(1) are then used to be written back to storage nodes SN(1,1) and SNB(1,1) in accordance with operation of memory array 100. As can be seen, node SN(1,1) that is supposed to store a low is written with a low from signal BL and node SNB(1,1) that is supposed to store a high is written with a high from signal BLB.

If node SN(1,1) stores a high and node SNB(1,1) therefore stores a low, signal BLB(1) starts to discharge. Signal BL(1), however, maintains at the high voltage level (e.g., Vdd). As signal BLB is discharged, its voltage level is lowered, e.g., from Vdd to Vdd−Dv. Sense amplifier SA, recognizing the voltage difference between signals BL(1) and BLB(1), detects the logic states stored in nodes SN(1,1) and SNB(1,1). Sense amplifier SA then based on the information received from signals BL(1) and BLB(1) provides a high (e.g., Vdd) to the gate of transistor N2 to turn it on so that it pulls signal BLB(1) from its level of Vdd−Dv to ground. Sense amplifier SA also provides a low (e.g., ground) to the gate of transistor N1 to turn it off. Because transistor N1 is off, signal BL(1) is not affected, e.g., remaining at its high level (e.g., Vdd). The logic level high at signal BL(1) and low at signal BLB(1) are then used to be written back to storage nodes SN(1,1) and SNB(1,1) in accordance with operation of memory array 100. As can be seen, node SN(1,1) that is supposed to store a high is written with a high from signal BL(1) and node SNB(1,1) that is supposed to store a low is written with a low from signal BLB(1).

In various embodiments, actual reading of the data in a cell C (e.g., cell C(1,1)) occurs when signal SAE is activated and turns on sense amplifier SA. The read data from memory cell C(1,1) that is transferred to lines BL(1) and BLB(1) is passed to the respective nodes OSA1 and OSA2, output to a read buffer (e.g., read buffer RB), and is read from output Qout. At the same time, writing back occurs, but is done by a different circuitry (e.g., transistors N1 and N2). As a result, writing back does not affect read access of a cell C.

Figure 2:
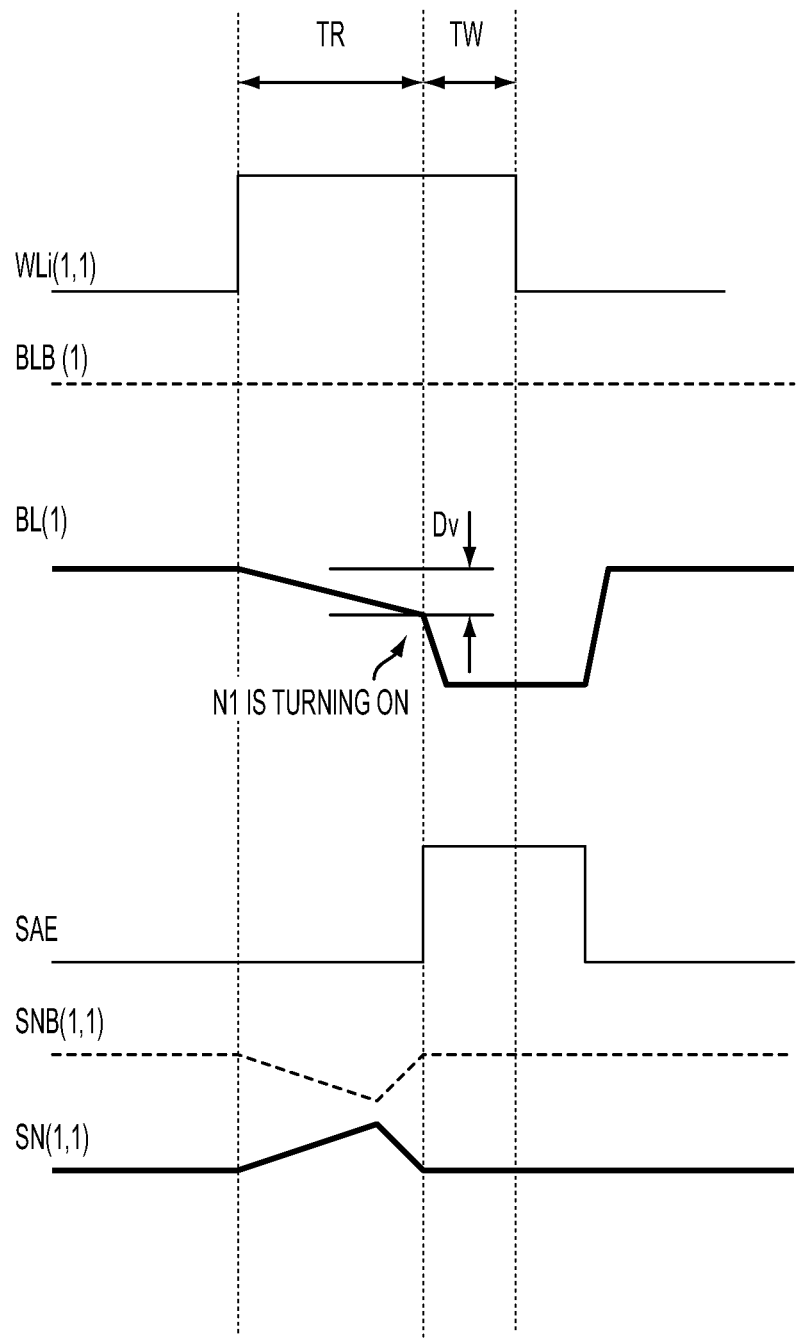
FIG. 2 shows signals illustrating reading and writing back to a cell of the array in FIG. 1.

FIG. 2 shows signals illustrating reading and writing back to cell C(1,1) in accordance with an embodiment. Time period TR is the read-preparation or discharging period. Time period TW is the actual reading and writing period. For example, once the read data in memory cell C(1,1) that is transferred to lines BL(1) and BLB(1) appears at the respective output OSA1 and OSA2 of sense amplifier SA, the data is transferred to read buffer RB, and is read from output Qout. At the same time, the data at nodes SA1 and SA2 is passed to the gate of the respective transistors N1 and N2 for writing back as explained above.

Once cell C(1,1) is selected (e.g., activated), signal WL(1) is passed to node WLi(1,1) and is therefore high during both time period TR and time period TW. Otherwise when cell C(1,1) is de-activated, signal WLi(1,1) is low.

Signals BL(1) and BLB(1) have been pre-charged to a high before reading (e.g., before time period TR). Signal BLB(1) remains high during both time periods TR and TW. This logic high of signal BLB(1) is written back to node SNB(1,1) during time period TW.

During time period TR signal BL(1) starts to discharge from a high (e.g., Vdd) to Vdd−Dv. When transistor N1 is on at the beginning of time period TW (e.g., for writing) signal BL(1) is pulled to a low and stays low during this time period TW for writing, in which the logic low of signal BL(1) is written back to node SN(1,1). Once signal SAE is deactivated after writing, signal BL returns to a high.

During time period TR for reading preparation (e.g., discharging) signal SAE is deactivated (e.g., low) and is activated (e.g., high) for sense amplifier SA to write during time period TW, and for read buffer RB to actually output the data. Depending on applications, signal SAE is deactivated again some time after writing (after time period TW). As explained above, in various embodiments, the read access time of a cell C (e.g., cell C(1,1)) depends on the time when signal SAE is activated. Because writing back also occurs when signal SAE is activated during time period TW, but by a different circuit/mechanism (e.g., transistors N1 and N2), which is independent of the actual read circuitry (e.g., read buffer RB, output Qout), writing back does not affect read access of a cell C.

During time period TR, transistors T3(1,1) and T4(1,1) are on which turns on a discharge path between transistor T3 and inverter INV2(1,1). As a result, the voltage level at node SN(1,1) rises, and, because of the cross latch including inverters INV1(1,1) and INV2(1,1), the voltage level at node SNB (1,1) is pulled down. As can be seen, if the voltage level at node SN(1,1) keeps rising and the voltage level at node SNB (1,1) keeps lowering, then up to a point the logic state of nodes SN(1,1) and SNB(1,1) would flip. In various embodiments, regardless of what occurs at node SN(1,1) and SNB(1,1), these nodes are written back with appropriate data (e.g., a low at node SN(1,1) and a high at node SNB(1,1) in the above illustration).

Second Embodiment

In various embodiments, signals WL and SEL are swapped to provide the functions consistent with the spirit and scope of the invention as explained in this document. For example, signals YSELB passing through inverters to be active high and perform the function of signals WL in the embodiment of FIG. 1. At the same time signals WL going through inverters to be active low and perform the function of signals YSELB in the embodiment of FIG. 1. That is, signals YSELB passing through inverters having outputs coupled to the drain of transistors T1 while signals WL passing through inverters having outputs coupled to the gate of transistors T1 (and T2). Since signals YSELB passing through inverters are active high, they perform the function as signals WL do in the embodiment of FIG. 1. Similarly, since signals WL passing through inverters are active low, they perform as signals YSELB do in the embodiment of FIG. 1.

Depending on applications and layouts, embodiments having signals WL and SEL not being swapped are beneficial for layout purposes. For example, a metal line using for a signal YSELB (e.g., signal YSELB(1)) can be conveniently connected to the poly forming the gate of transistors T1 and T2 of various cells C(1,j).

A number of embodiments have been described. It will nevertheless be understood that various modifications may be made without departing from the spirit and scope of the invention. For example, various transistors are shown to be NMOS (e.g., transistor T2, N1, N2, etc.) and some others are shown to be PMOS (e.g., transistor T1), but the invention is not limited to such a configuration because selecting a transistor type (e.g., NMOS or PMOS) is a matter of design choice based on need, convenience, etc. Embodiments of the invention are applicable in various variations and combinations of transistor types. Further, some signals are illustrated with a particular logic level to operate some transistors (e.g., signals WL being activated high, deactivated low; signals YSELB being activated low, deactivated high, etc.), but selecting such levels and transistors are also a matter of design choice, and embodiments of the invention are applicable in various design choices. Electronic components in conjunction with corresponding voltage and current are shown to perform a certain function for illustration only (e.g., transistors T1 passing signals WL to node WLi, transistor N1 pulling signal BL to ground, sense amplifier SA passing appropriate signals to the gate of transistors N1 and N2, etc.), but similar components and/or circuitry may be used to perform the intended functions, and the invention is not limited to a particular circuit or component.

This above description of the exemplary embodiments is to be read in connection with the accompanying drawings, which are considered part of the entire written description. In the description, orientation terms such as rows and columns should be construed to refer to the orientation as then described and as shown in the drawing under discussion. These terms are for convenience of description and do not require that the circuit or apparatus be constructed or operated in a particular orientation.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A method comprising:
controlling a row of cells of a memory array with a first signal;
controlling a column of cells of the memory array with a second signal;
generating a third signal responsive to the first signal and the second signal;
transferring data from a cell activated by the third signal to a pair of bit lines associated with the cell; and
using the data from the pair of bit lines as read data and as data written back to the cell.

2. The method of claim 1 wherein the first signal serves as a word line for the memory array.

3. The method of claim 1 wherein writing the data back to the cell comprises detecting a voltage difference between the pair of bit lines.

4. The method of claim 1 wherein writing the data back to the cell comprises detecting a logic level stored in the cell and writing the data based on this logic level.

5. The method of claim 1 wherein the second signal controls a plurality of inverters of a respective plurality of cells in the column.

6. The method of claim 1 wherein the first signal and the second signal have two opposite logic states.

7. A memory array comprising:
a plurality of cells arranged in rows and columns;
a first signal path configured to control cells in a row of the rows;
a second signal path configured to control cells in a column of the columns, the first signal path and the second signal path thereby together control a corresponding cell of the plurality of cells;
a logic circuit in the corresponding cell, the logic circuit being configured to generate a control signal to activate the corresponding cell in response to signals on the first signal path and the second signal path; and
a plurality of pairs of bit lines sharing a sense amplifier through a plurality of pass gates, each pair of the plurality of pairs of bit lines coupled to cells in a corresponding one of the columns, and both bit lines of a pair of the plurality of pairs of bit lines associated with the corresponding cell.

8. The memory array of claim 7 wherein the first signal path and the second signal path include an opposite logic level when activating the corresponding cell.

9. The memory array of claim 7 wherein the sense amplifier is configured to receive read data from the corresponding cell that is transferred to the pair of bit lines as inputs to provide data to be written to the corresponding cell.

10. The memory array of claim 9 wherein the sense amplifier is configured to detect a difference between logic levels of the pair of bit lines.

11. The memory array of claim 7 wherein the logic circuit is an inverter, and the second signal path is coupled to a gate of the inverter.

12. The memory array of claim 7 wherein the logic circuit is an inverter, the first signal path includes a word line of the memory array, and the second signal path includes a metal line coupled to a gate of the inverter.

13. The memory array of claim 7 further comprising a pair of devices corresponding to the pair of bit lines; a device of the pair of devices being configured to affect a voltage level of a bit line of the pair of bit lines.

14. The memory array of claim 7 further comprising a device corresponding to a bit line; the device being configured to pull a voltage level of the bit line towards ground after discharging in a read operation.

15. A method comprising:
using a first signal, serving as a word line of a memory array, and a second signal, controlling a column of memory cells, to generate a third signal;
activating a memory cell in response to the third signal;
pre-charging a pair of bit lines corresponding to the memory cell;
transferring data and complement data stored in the memory cell to the respective pair of bit lines;
recognizing a difference in voltage levels at the pair of bit lines;
based on the difference between the voltage levels at the pair of bit lines determining data stored in the memory cell; and
writing the determined data stored in the memory cell to the memory cell.

16. The method of claim 15 further comprising, before writing the determined data stored in the memory cell, generating a logic level compatible to a logic level corresponding to the data stored in the memory cell.

17. The method of claim 15 wherein other cells in the memory array are deactivated during the memory cell being activated.

18. The method of claim 15 wherein the pair of bit lines and other pairs of bit lines corresponding to other cells of the memory array are coupled to a sense amplifier through corresponding pairs of pass gates.

19. The method of claim 15 wherein the first signal and the second signal are at two opposite levels when the memory cell is activated.

20. The method of claim 15 wherein the second signal being coupled to gates of a plurality of inverters in the column.

* * * * *